(12) United States Patent
Hashimoto et al.

(10) Patent No.: US 7,312,530 B2
(45) Date of Patent: Dec. 25, 2007

(54) SEMICONDUCTOR DEVICE WITH MULTILAYERED METAL PATTERN

(75) Inventors: Shin Hashimoto, Osaka (JP); Tadaaki Mimura, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/945,902

(22) Filed: Sep. 22, 2004

(65) Prior Publication Data

US 2005/0067707 A1    Mar. 31, 2005

(30) Foreign Application Priority Data

Sep. 26, 2003    (JP)   ............... 2003-335267

(51) Int. Cl.
*H01L 21/44*    (2006.01)

(52) U.S. Cl. ............... 257/758; 257/773; 257/774; 257/775; 257/776; 257/E21.597

(58) Field of Classification Search ........ 257/773–776, 257/758, E21.597
See application file for complete search history.

(56) References Cited

U.S. PATENT DOCUMENTS

| | | | | |
|---|---|---|---|---|
| 5,502,337 A | * | 3/1996 | Nozaki | 257/773 |
| 5,700,735 A | * | 12/1997 | Shiue et al. | 438/612 |
| 5,764,485 A | * | 6/1998 | Lebaschi | 361/774 |
| 5,847,466 A | * | 12/1998 | Ito et al. | 257/775 |
| 6,031,293 A | * | 2/2000 | Hsuan et al. | 257/786 |
| 6,037,668 A | * | 3/2000 | Cave et al. | 257/784 |
| 6,133,625 A | * | 10/2000 | Maeda | 257/678 |
| 6,143,396 A | | 11/2000 | Saran et al. | |
| 6,163,074 A | * | 12/2000 | Lee et al. | 257/734 |
| 6,297,563 B1 | * | 10/2001 | Yamaha | 257/781 |
| 6,313,537 B1 | * | 11/2001 | Lee et al. | 257/758 |
| 6,411,492 B1 | * | 6/2002 | Kar-Roy et al. | 361/305 |
| 6,448,650 B1 | * | 9/2002 | Saran et al. | 257/758 |
| 6,477,054 B1 | * | 11/2002 | Hagerup | 361/720 |
| 6,486,558 B2 | * | 11/2002 | Sugiyama et al. | 257/758 |
| 6,504,254 B2 | * | 1/2003 | Takizawa | 257/758 |

(Continued)

FOREIGN PATENT DOCUMENTS

CN      1381887 A     11/2002

(Continued)

OTHER PUBLICATIONS

Chinese Office Action Issued in corresponding Chinese Patent Application No. CN 200410082604.1, dated Sep. 15, 2006.

*Primary Examiner*—Eugene Lee
(74) *Attorney, Agent, or Firm*—McDermott Will & Emery LLP

(57) ABSTRACT

A semiconductor device comprises a first insulating film formed on a semiconductor substrate, a first metal pattern formed on the first insulating film, a second insulating film formed on the first metal pattern, a second metal pattern formed on the second insulating film, and a third metal pattern formed in the second insulating film and connecting between the first metal pattern and the second metal pattern. The third metal pattern is a single continuous structure, and the principal orientation axes of crystals of a metal constituting the third metal pattern are parallel to the principal surface of the semiconductor substrate.

12 Claims, 11 Drawing Sheets

U.S. PATENT DOCUMENTS

| | | | |
|---|---|---|---|
| 6,507,989 B1 * | 1/2003 | Bowden et al. | 29/592.1 |
| 6,552,438 B2 * | 4/2003 | Lee et al. | 257/784 |
| 6,586,839 B2 | 7/2003 | Chisholm et al. | |
| 6,737,714 B2 * | 5/2004 | Masuda et al. | 257/401 |
| 6,762,466 B2 * | 7/2004 | Huang et al. | 257/395 |
| 6,787,928 B1 * | 9/2004 | Lin | 257/786 |
| 7,026,664 B2 * | 4/2006 | Divakar et al. | 257/107 |
| 2002/0017672 A1 | 2/2002 | Ker et al. | |
| 2002/0025417 A1 * | 2/2002 | Chisholm et al. | 428/209 |
| 2002/0195723 A1 * | 12/2002 | Collette | 257/786 |
| 2003/0155642 A1 | 8/2003 | Davis et al. | |
| 2003/0218255 A1 * | 11/2003 | Park et al. | 257/758 |
| 2004/0145045 A1 * | 7/2004 | Huang et al. | 257/700 |
| 2005/0023700 A1 * | 2/2005 | Singh et al. | 257/773 |

FOREIGN PATENT DOCUMENTS

| | | |
|---|---|---|
| JP | 5-343468 | 12/1993 |
| JP | 2001-203329 | 7/2001 |
| JP | 2002-134509 | 5/2002 |

* cited by examiner

SEMICONDUCTOR DEVICE WITH MULTILAYERED METAL PATTERN

CROSS-REFERENCE TO RELATED APPLICATIONS

The disclosure of Japanese Patent Application No. 2003-335267 filed on Sep. 26, 2003 including specification, drawing and claims is incorporated herein by reference in its entirety.

BACKGROUND OF THE INVENTION (1) Field of the Invention

The present invention relates to a semiconductor device having a probe pad of a POE (Pad on element) type in which a pad is formed on semiconductor active elements, and more particularly relates to a connection structure of an electrode pad part of a semiconductor device.

(2) Description of Related Art

The structure of an electrode pad part of a known semiconductor device will be described hereinafter with reference to FIGS. 12 and 13 (see, for example, Japanese Laid-Open Patent Publication No. 5-343466).

FIG. 12 is a cross-sectional view of the principal part of a known semiconductor device showing the structure of an electrode pad part of the known semiconductor device. FIG. 13 is a plan view taken along the line XIII-XIII shown in FIG. 12.

As shown in FIG. 12, a first interconnect layer 2 is formed on a predetermined region of a semiconductor substrate 1. A first interlayer insulating film 3 is formed on the semiconductor substrate 1 and first interconnect layer 2. As shown in FIG. 13, a plurality of first contact holes 3a are formed in a region of the first interlayer insulating film 3 located on the first interconnect layer 2, and a second interconnect layer 4 is formed inside the first contact holes 3a and on the region of the first interlayer insulating film 3 located on the first interconnect layer 2. A second interlayer insulating film 5 is formed on the first interlayer insulating film 3 and the second interconnect layer 4. As shown in FIG. 13, a plurality of second contact holes 5a are formed in a region of the second interlayer insulating film 5 located on the second interconnect layer 4.

A third interconnect layer 6 is formed inside the second contact holes 5a and on a predetermined region of the second interlayer insulating film 5 located on the second interconnect layer 4. The third interconnect layer 6 serves as a pad electrode. A protective film 7 is formed on a predetermined region of the third interconnect layer 6 and on the second interlayer insulating film 5. A pad opening 7a with a desired opening area is formed in a region of the protective film 7 located on the third interconnect layer 6. An unshown bonding wire is connected to the third interconnect layer 6 through the pad opening 7a to allow the input/output of signals from/to an external circuit through the bonding wire.

Since the interlayer insulating films are placed on the first interconnect layer 2 and the second interconnect layer 4 in the electrode pad part having such a structure, the third interconnect layer 6 serving as the electrode pad can be formed in a higher position. In addition, the step height h1 between the top surfaces of the third interconnect layer 6 and protective film 7 can be reduced. In other words, the pad opening 7a, which constitutes a recess of the electrode pad part, can be made shallow. The formation of the shallow pad opening 7a can effectively reduce the occurrence of cracks in the protective film 7. As a result, the reliability of a semiconductor device can be enhanced.

As described above, in the structure of the electrode pad part of the known semiconductor device, the second interlayer insulating film 5 is provided between the second interconnect layer 4 and the third interconnect layer 6, thereby allowing the pad opening 7a of the electrode pad part to be shallow. In this way, cracks that may occur in the protective film 7 are reduced.

However, in the structure of the electrode pad part of the known semiconductor device, a stress caused by a load to an electrode pad during probing and bonding produces a crack in an insulating film formed below the electrode pad. The reason why a crack is produced as described above is that the insulating film located below the electrode pad has a low strength and thus the stress caused by the load to the electrode pad cannot be absorbed by the insulating film located below the electrode pad. When the produced crack reaches an insulating film further below the electrode pad, this damages a semiconductor element below the insulating film.

To be specific, as shown in FIG. 14, when a probe needle 14a comes into contact with the third interconnect layer 6 serving as an electrode pad, that is, when the tip of the probe needle 14a is pressed against the electrode pad with an appropriate needle pressure, the probe needle 14a slides in the horizontal direction 14b and the tip of the probe needle 14a is engaged in the electrode pad. Thus, a low contact electrical resistance can be obtained between the probe needle 14a and the electrode pad. In this case, the stress applied from the probe needle 14a is used for the plastic deformation of a metal constituting the electrode pad. However, as the probe needle 14a comes into contact with the electrode pad again and again, the electrode pad becomes thinner. Then, when the tip of the probe needle 14a reaches the vicinity of the bottom surface of the electrode pad, the stress is applied from the probe needle 14a even to the underlying structure of the electrode pad, thereby producing a crack 14c. Therefore, a leakage current flows along the produced crack 14c, leading to a malfunction in a circuit placed below the electrode pad.

SUMMARY OF THE INVENTION

In view of the above, an object of the present invention is to provide a semiconductor device that can prevent cracks from occurring in an electrode pad part and a method for fabricating the same.

In order to solve the above problem, a semiconductor device according to a first aspect of the present invention comprises: a first insulating film formed on a semiconductor substrate; a first metal pattern formed on the first insulating film; a second insulating film formed on the first metal pattern; a second metal pattern formed on the second insulating film; and a third metal pattern connecting between the first metal pattern and the second metal pattern, said third metal pattern being formed in the second insulating film, wherein the third metal pattern is a single continuous structure, and the principal orientation axes of crystals of a metal constituting the third metal pattern are parallel to the principal surface of the semiconductor substrate.

According to the semiconductor device of the first aspect of the present invention, since the third metal pattern is formed in the underlying layer of the second metal pattern, the underlying structure of the second metal pattern has an excellent strength. In particular, a stress caused by probing orthogonal to the orientation axes of the third metal pattern or a stress caused by bonding can be dispersed to relax the impact of the stress against the underlying layer of the second metal pattern. Therefore, cracks can be restrained from occurring in the underlying layer of the second metal pattern.

In the semiconductor device of the first aspect of the present invention, it is preferable that the distribution of orientations of the principal orientation axes of crystals of the metal constituting the third metal pattern is substantially uniform in a plane parallel to the principal surface of the semiconductor substrate.

In this way, a stress caused by probing from any direction or a stress caused by bonding can be dispersed by the third metal pattern to relax the impact of the stress against the underlying layer of the second metal pattern. Therefore, cracks can be restrained from occurring in the underlying layer of the second metal pattern.

In the semiconductor device of the first aspect of the present invention, it is preferable that the metal constituting the third metal pattern has a body-centered cubic structure and the principal orientation axes of crystals of the metal constituting the third metal pattern are <110> axes.

In this way, since the <110> axis direction of a metal thin film having a body-centered structure is the direction to which close-packed crystals of the metal thin film are preferentially oriented, the metal thin film is strongest in that axis against a shearing stress, and the stress caused by probing or stress caused by bonding can be dispersed to relax the impact of the stress against the underlying layer of the second metal pattern. Therefore, cracks can be restrained from occurring in the underlying layer of the second metal pattern.

In the semiconductor device of the first aspect of the present invention, the metal constituting the third metal pattern is preferably tungsten.

In the semiconductor device of the first aspect of the present invention, the spatial symmetry of the third metal pattern is preferably a 3-fold symmetry in a plane parallel to the principal surface of the semiconductor substrate.

In this way, a stress caused by probing from any direction or a stress caused by bonding can be dispersed by the third metal pattern to relax the impact of the stress against the underlying layer of the second metal pattern. Therefore, cracks can be restrained from occurring in the underlying layer of the second metal pattern.

In order to solve the above problem, a semiconductor device of a second aspect of the present invention comprises: a first insulating film formed on a semiconductor substrate; a first metal pattern formed on the first insulating film; a second insulating film formed on the first metal pattern; a second metal pattern formed on the second insulating film; and a third metal pattern connecting between the first metal pattern and the second metal pattern, said third metal pattern being formed in the second insulating film, wherein the third metal pattern is a single continuous structure.

According to the semiconductor device of the second aspect of the present invention, since the third metal pattern is formed in the underlying layer of the second metal pattern, the underlying structure of the second metal pattern has an excellent strength. In this way, for example, a stress caused by the pressure of a probe needle during probing or a stress caused by bonding can be dispersed by the third metal pattern to relax the impact of the stress against the underlying layer of the second metal pattern. Therefore, cracks can be restrained from occurring in the underlying layer of the second metal pattern.

In order to solve the above problem, a semiconductor device of a third aspect of the present invention comprises: a first insulating film formed on a semiconductor substrate; a first metal pattern formed on the first insulating film; a second insulating film formed on the first metal pattern; a second metal pattern formed on the second insulating film; and a third metal pattern connecting between the first metal pattern and the second metal pattern, said third metal pattern being formed in the second insulating film, wherein the spatial symmetry of the third metal pattern is a 3-fold symmetry in a plane parallel to the principal surface of the semiconductor substrate.

According to the semiconductor device of the third aspect of the present invention, since the third metal pattern is formed in the underlying layer of the second metal pattern, the underlying structure of the second metal pattern has an excellent strength. In this way, for example, a stress caused by the pressure of a probe needle during probing or a stress caused by bonding can be dispersed by the third metal pattern to relax the impact of the stress against the underlying layer of the second metal pattern. Therefore, cracks can be restrained from occurring in the underlying layer of the second metal pattern.

In order to solve the above problem, a semiconductor device of a fourth aspect of the present invention comprises: a first insulating film formed on a semiconductor substrate; a first metal pattern formed on the first insulating film; a second insulating film formed on the first metal pattern; a second metal pattern formed on the second insulating film; and a third metal pattern connecting between the first metal pattern and the second metal pattern, said third metal pattern being formed in the second insulating film, wherein the third metal pattern has a honeycomb structure.

According to the semiconductor device of the fourth aspect of the present invention, since the third metal pattern is formed in the underlying layer of the second metal pattern, the underlying structure of the second metal pattern has an excellent strength. In this way, for example, a stress caused by the pressure of a probe needle during probing or a stress caused by bonding can be dispersed by the third metal pattern to relax the impact of the stress against the underlying layer of the second metal pattern. Therefore, cracks can be restrained from occurring in the underlying layer of the second metal pattern.

Preferably, the semiconductor device of the second, third or fourth aspect of the present invention further comprises at least one first interconnect electrically insulated from the first metal pattern through the first insulating film, said first interconnect being formed below the first metal pattern, wherein the first metal pattern is different from the first interconnect in electrical potential.

Preferably, the semiconductor device of the second, third or fourth aspect of the present invention further comprises at least one second interconnect electrically connected to the first metal pattern with the first insulating film interposed therebetween, said second interconnect being formed below the first metal pattern, wherein the first metal pattern is connected to the second interconnect through a via formed in the first insulating film.

In the semiconductor device of the second, third or fourth aspect of the present invention, the area of the first metal pattern is preferably larger than that of the second metal pattern.

In the semiconductor device of the second, third or fourth aspect of the present invention, semiconductor active elements are preferably formed on a region of the semiconductor substrate overlapping the first metal pattern in plan configuration.

In this way, since a semiconductor element can be formed below the second metal pattern occupying a large area on a semiconductor chip, the area of a semiconductor chip can drastically be reduced using a known process without miniaturization of semiconductor active elements or the like.

In the semiconductor device of the second, third or fourth aspect of the present invention, in plan configuration, the proportion of the third metal pattern to the region of the semiconductor device in which the second metal pattern is formed is preferably 50% or more.

In this way, since the underlying structure of the second metal pattern has a higher strength, the occurrence of cracks can further be prevented.

In the semiconductor device of the second, third or fourth aspect of the present invention, the metal constituting the first metal pattern is preferably aluminum or copper.

In the semiconductor device of the second, third or fourth aspect of the present invention, the metal constituting the second metal pattern is preferably aluminum or copper.

In the semiconductor device of the second, third or fourth aspect of the present invention, the metal constituting the third metal pattern is preferably tungsten or copper.

In order to solve the above problem, a method for fabricating a semiconductor device of a first aspect of the present invention comprises the steps of: forming a first insulating film on a semiconductor substrate; forming a first metal layer on the first insulating film; patterning the first metal layer to form at least one first interconnect and a first pad; forming a second insulating film on the first interconnect and the first pad; simultaneously forming, in the second insulating film, at least one hole-like first opening exposing the first interconnect and a trench-like second opening exposing the first pad; filling the first opening with a metal to form at least one first via connected to the first interconnect and simultaneously filling the second opening with the metal to form a network via connected to the first pad; forming a second metal layer on the second insulating film, the first via and the network via; and patterning the second metal layer to form at least one second interconnect connected to the first via and a second pad connected to the network via, wherein the network via is a single continuous structure.

According to the method for fabricating a semiconductor device of the first aspect of the present invention, since the network via is formed in the underlying layer of the second pad, the underlying structure of the second pad has an excellent strength. In this way, for example, a stress caused by the pressure of a probe needle during probing or a stress caused by bonding can be dispersed by the network via to relax the impact of the stress against the underlying layer of the second pad. Therefore, cracks can be restrained from occurring in the underlying layer of the second pad. Furthermore, the first openings and the second opening can simultaneously be formed without the addition of a new process step, and the first via and the network via can simultaneously be formed without the addition of a new process step.

In order to solve the problem, a method for fabricating a semiconductor device of a second aspect of the present invention comprising the steps of: forming a first insulating film on a semiconductor substrate; forming a first metal layer on the first insulating film; patterning the first metal layer to form at least one first interconnect and a first pad; forming a second insulating film on the first interconnect and the first pad; forming, in the second insulating film, at least one hole-like first opening exposing the first interconnect and a trench-like second opening exposing the first pad; in a common step, filling the first opening with a metal to form at least one first via connected to the first interconnect and filling the second opening with the metal to form a network via connected to the first pad; forming a second metal layer on the second insulating film, the first via and the network via; and patterning the second metal layer to form at least one second interconnect connected to the first via and a second pad connected to the network via, wherein the spatial symmetry of the network via is a 3-fold symmetry in a plane parallel to the principal surface of the semiconductor substrate.

According to the method for fabricating a semiconductor device of the second aspect of the present invention, since the network via is formed in the underlying layer of the second pad, the underlying structure of the second pad has an excellent strength. In this way, for example, a stress caused by the pressure of a probe needle from any direction during probing or a stress caused by bonding can be dispersed by the network via to relax the underlying layer of the second pad. Therefore, cracks can be restrained from occurring in the underlying layer of the second pad. Furthermore, the first openings and the second opening can simultaneously be formed without the addition of a new process step, and the first via and the network via can simultaneously be formed without the addition of a new process step.

In order to solve the problem, a method for fabricating a semiconductor device of a third aspect of the present invention comprises the steps of: forming a first insulating film on a semiconductor substrate; forming a first metal layer on the first insulating film; patterning the first metal layer to form at least one first interconnect and a first pad; forming a second insulating film on the first interconnect and the first pad; forming, in the second insulating film, at least one hole-like first opening exposing the first interconnect and a trench-like second opening exposing the first pad; in a common step, filling the first opening with a metal to form at least one first via connected to the first interconnect and filling the second opening with the metal to form a network via connected to the first pad; forming a second metal layer on the second insulating film, the first via and the network via; and patterning the second metal layer to form at least one second interconnect connected to the first via and a second pad connected to the network via, wherein the network via has a honeycomb structure.

According to the method for fabricating a semiconductor device of the third aspect of the present invention, since the network via is formed in the underlying layer of the second pad, the underlying structure of the second pad has an excellent strength. In this way, for example, a stress caused by the pressure of a probe needle from any direction during probing or a stress caused by bonding can be dispersed by the network via to relax the impact of the stress against the second pad. Therefore, cracks can be restrained from occurring in the underlying layer of the second pad. Furthermore, the first openings and the second opening can simultaneously be formed without the addition of a new process step, and the first via and the network via can simultaneously be formed without the addition of a new process step.

In the method for fabricating a semiconductor device of the first, second or third aspect of the present invention, it is preferable that at least one third interconnect is formed below the first pad so as to be electrically isolated from the first pad through the first insulating film and the first pad is different from the third interconnect in electrical potential.

In the method for fabricating a semiconductor device of the first, second or third aspect of the present invention, it is preferable that at least one fourth interconnect is formed below the first pad so as to be electrically connected to the first pad with the first insulating film interposed therebetween and the first pad is electrically connected to the fourth interconnect through a second via formed in the first insulating film.

In the method for fabricating a semiconductor device of the first, second or third aspect of the present invention, the first pad is preferably formed to have a larger area than the second pad.

In the method for fabricating a semiconductor device of the first, second or third aspect of the present invention, in plan configuration, the proportion of the network via to the region of the semiconductor device in which the second metal pattern is formed is preferably 50% or more.

In the method for fabricating a semiconductor device of the first, second or third aspect of the present invention, the metal constituting the first metal pattern is preferably aluminum or copper.

In the method for fabricating a semiconductor device of the first, second or third aspect of the present invention, the metal constituting the second metal pattern is preferably aluminum or copper.

In the method for fabricating a semiconductor device of the first, second or third aspect of the present invention, the first via and the network via are preferably made of tungsten or copper.

DETAILED DESCRIPTION OF THE INVENTION

An embodiment of the present invention will be described hereinafter with reference to the drawings.

First, the structure of a semiconductor device according to the embodiment of the present invention will be described with reference to FIGS. 1 through 4.

Figure 1:
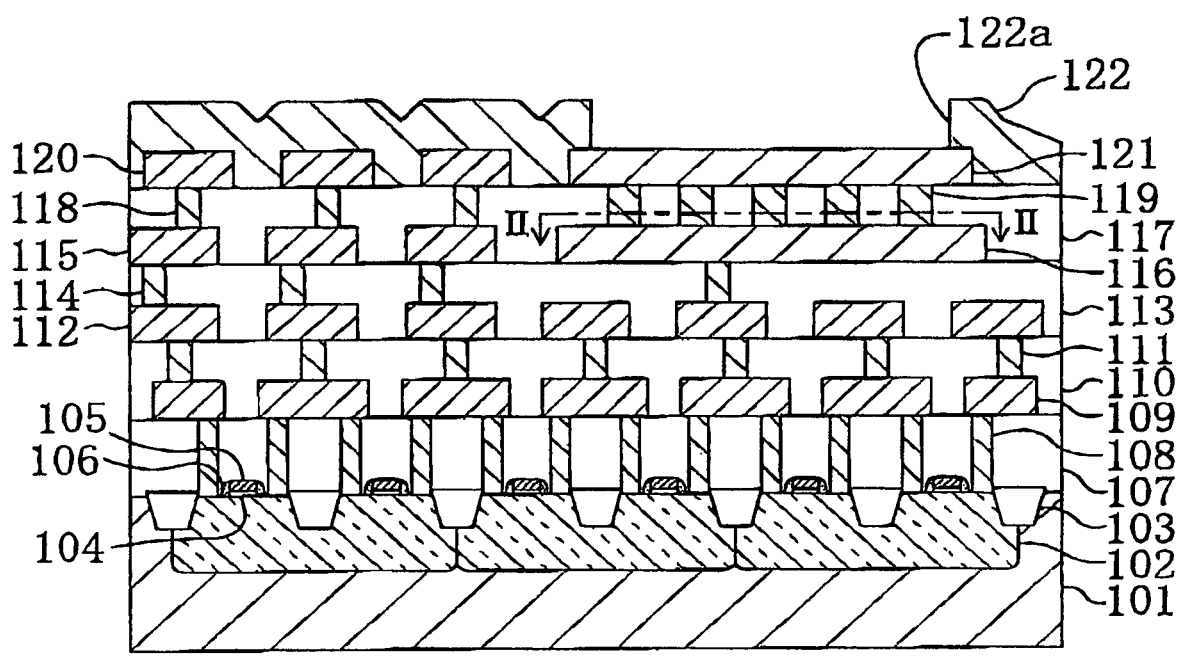
FIG. 1 is a cross-sectional view showing the structure of a semiconductor device according to an embodiment of the present invention.

FIG. 1 is a cross-sectional view showing the structure of the semiconductor device according to the embodiment of the present invention.

As shown in FIG. 1, a diffusion layer 102 is formed in the surface part of a silicon substrate 101. A gate insulating film 104 and a gate electrode 105 are successively formed in each of element formation regions located on the silicon substrate 101 and defined by an isolation insulating film 103. A sidewall 106 is formed on the side surfaces of the gate insulating film 104 and gate electrode 105. A first interlayer insulating film 107 is formed on the silicon substrate 101 to cover the gate insulating film 104, the gate electrode 105 and the sidewall 106. First vias 108 are formed in the first interlayer insulating film 107 to electrically connect the diffusion layer 102 to first interconnects 109 that will be described later.

Furthermore, as shown in FIG. 1, the first interconnects 109 are formed on the first interlayer insulating film 107, and a second interlayer insulating film 110 is also formed thereon to cover the first interconnects 109. Second vias 111 are formed in the second interlayer insulating film 110 to electrically connect the first interconnects 109 to second interconnects 112 that will be described later.

Furthermore, as shown in FIG. 1, the second interconnects 112 are formed on the second interlayer insulating film 110, and a third interlayer insulating film 113 is also formed thereon to cover the second interconnects 112. Third vias 114 are formed in the third interlayer insulating film 113 to electrically connect the second interconnects 112 to third interconnects 115 or a first pad 116 that will be described later.

Furthermore, as shown in FIG. 1, the third interconnects 115 and the first pad 116 are formed on the third interlayer insulating film 113, and a fourth interlayer insulating film 117 is also formed thereon to cover the third interconnects 115 and the first pad 116. Fourth vias 118 are formed in the fourth interlayer insulating film 117 to electrically connect the third interconnects 115 to fourth interconnects 120 that will be described later. A network via 119 is also formed therein to electrically connect the first pad 116 to a second pad 121 that will be described later.

Furthermore, as shown in FIG. 1, the fourth interconnects 120 are formed on the fourth interlayer insulating film 117 to electrically connect with the fourth vias 118, and the second pad 121 is also formed thereon to electrically connect with the network via 119. A protective film 122 is formed on the fourth interlayer insulating film 117 to cover the fourth interconnects 120 and the second pad 121, and a pad opening 122a is formed in the protective film 122 to expose the second pad 121.

Although in this embodiment the first pad 116 is connected through the third via 114 to the second interconnect 112 and thereby becomes electrically conductive with a semiconductor element located further below, the first pad 116 may be connected directly to the third interconnect 115. Alternatively, the second pad 121 may be connected directly to the fourth interconnect 120.

In this embodiment, the first vias 108, the second vias 111, the third vias 114, the fourth vias 118, and the network via 119 are made of tungsten. The first interconnects 109, the second interconnects 112, the third interconnects 115, the fourth interconnects 120, the first pad 116, and the second pad 121 are made of aluminum.

The network via 119 shown in FIG. 1 will be specifically described hereinafter.

Figure 2:
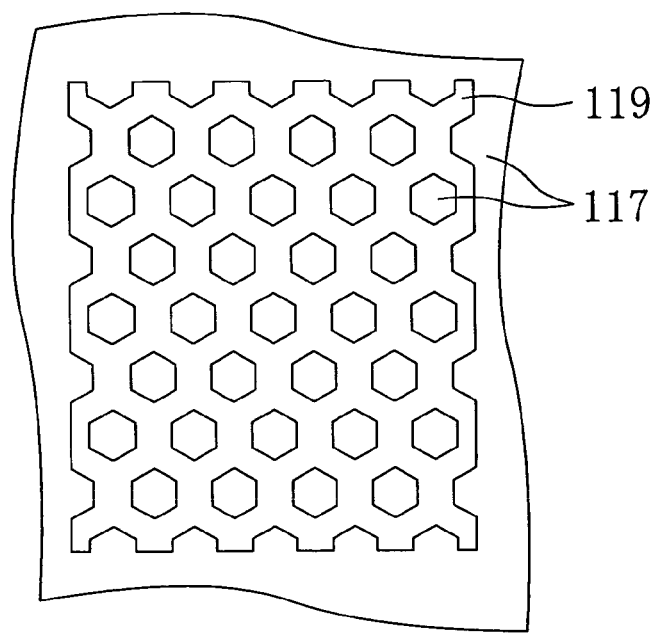
FIG. 2 is a plan view showing the structure of the semiconductor device according to the embodiment of the present invention and more specifically a plan view taken along the line II-II shown in FIG. 1.

First, the structure of the network via 119 shown in FIG. 1 will be specifically described with reference to FIG. 2. FIG. 2 is a plan view taken along the line II-II shown in FIG. 1 and shows the structure of the network via 119.

As shown in FIG. 2, the network via 119 is a single continuous structure obtained by forming a trench-shaped opening in the fourth insulating film 117 and then filling the trench-shaped opening with tungsten. To be specific, as shown in FIG. 2, the network via 119 has a honeycomb structure, that is, a structure in which the opening is filled with tungsten in the form of a honeycomb without interruption. Since the network via 119 has such a structure, an electrode pad part of the device can maintain an excellent strength against a load applied to the second pad 121 during probing and bonding. This can prevent a crack from occurring in the electrode pad part. Hence, a leakage current is not produced even when the second interconnects 112 are formed immediately below the first pad 116 to be different from the third interconnects 115 and the first pad 116 in electrical potential. Therefore, even when semiconductor active elements or the like are formed on a region of the substrate located further below the first pad 116, the semiconductor element can be operated normally.

It is preferable that the first pad 116 and the second pad 121 are formed such that the first pad 116 is larger than the second pad 121. More particularly, the first pad 116 and the second pad 121 are formed such that the area of the top surface of the first pad 116 is larger than that of the top surface of the second pad 121, thereby enhancing the effect of preventing a crack from occurring. The reason for this is as follows. When the edges of the second pad 121 and first pad 116 are aligned with each other and further aligned with the edges of the second interconnect 112, this decreases the strength of the underlying structure of the second pad 121 against the stress caused by the load applied to the second pad 121. However, if the first pad 116 and the second pad 121 are formed such that the area of the top surface of the first pad 116 is larger than that of the top surface of the second pad 121, this can prevent the strength of the underlying structure of the second pad 121 from decreasing.

Next, with reference to FIGS. 3 and 4, a description will be given of the relationship between the area fraction of vias to the fourth interlayer insulating film 117 between the first pad 116 and the second pad 121 as shown in FIG. 1 and the probability of cracks.

Figure 3:
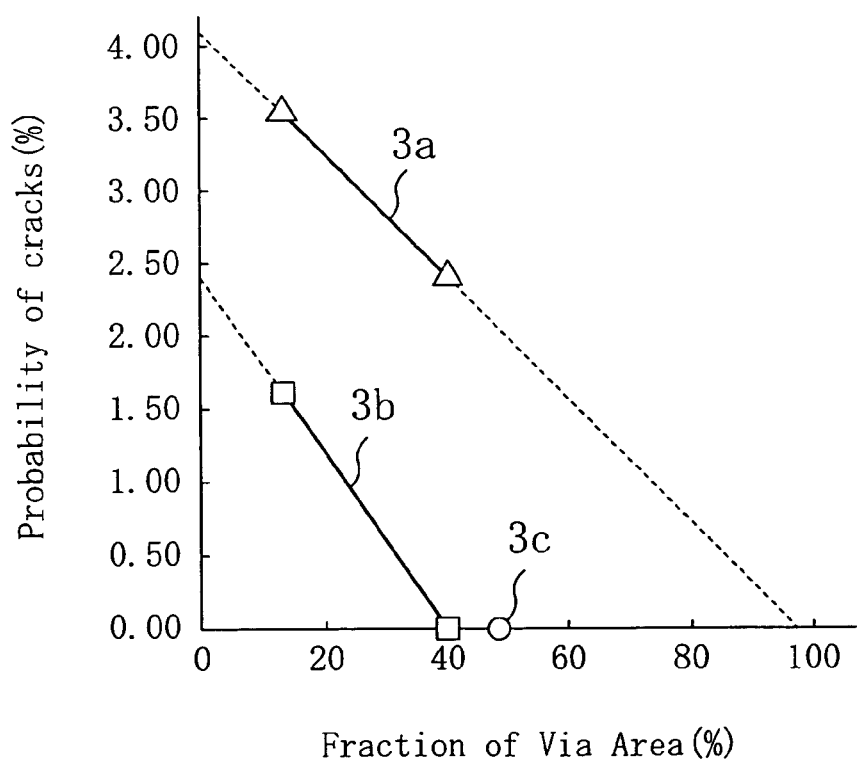
FIG. 3 is a graph showing the relationship between the fraction of a via area and the probability of cracks.
Figure 4A:
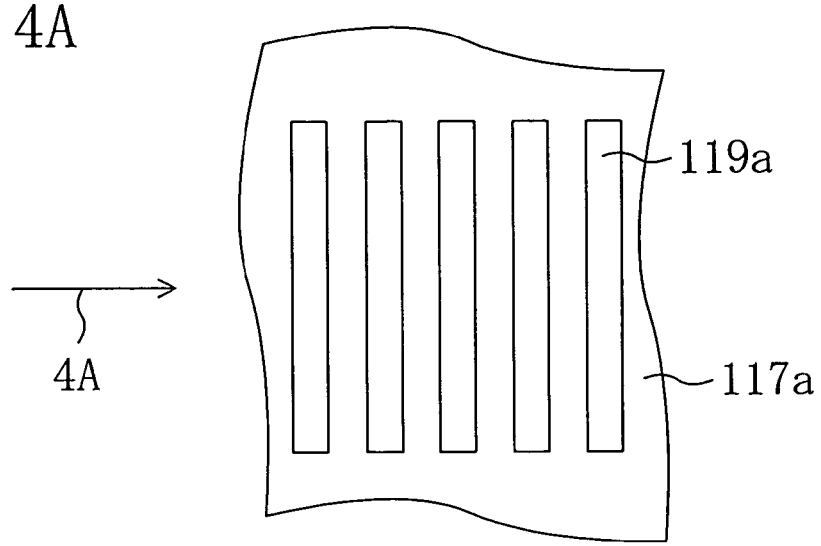
FIGS. 4A through 4C are plan views showing via structures for explaining the relationship between the probability of cracks and the exemplary via structures.
Figure 4B:
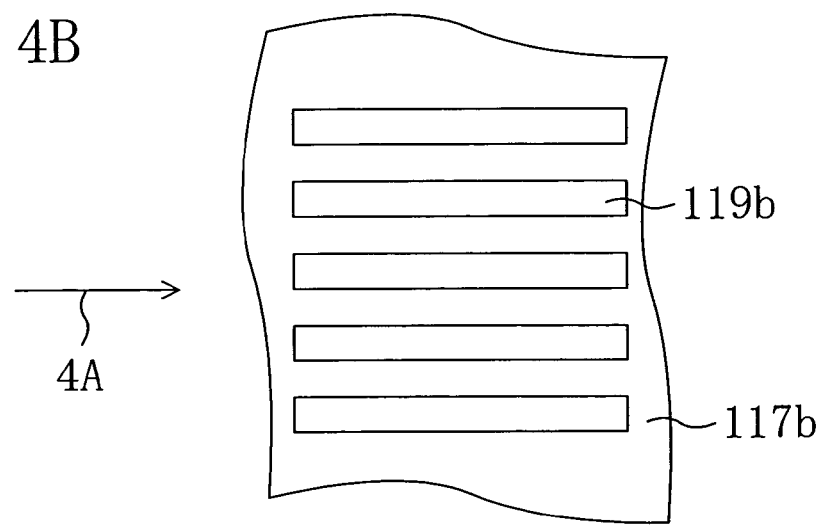
Figure 4C:
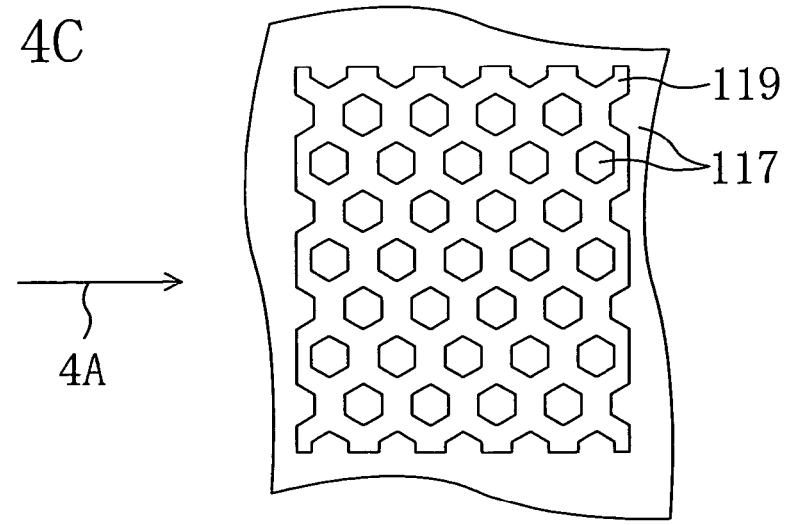

FIG. 3 is a graph showing the relationship between the fraction of a via area and the probability of cracks. FIGS. 4A through 4C are plan views showing exemplary via structures.

In FIG. 3, the graph 3a shows the above-mentioned relationship when, as shown in FIG. 4A, a plurality of line-shaped vias 119a are formed parallel to a fourth interlayer insulating film 117a, and the probe needle scans the pad from the direction 4A of entry across the vias 119a. Furthermore, the graph 3b shows the above-mentioned relationship when, as shown in FIG. 4B, a plurality of line-shaped vias 119b are formed parallel to a fourth interlayer insulating film 117b, and the probe needle scans the pad from the direction 4A of entry along the vias 119b. Moreover, the graph 3c shows the above-mentioned relationship when, as shown in FIG. 4C, the network via 119 of this embodiment having a honeycomb structure is formed, and the probe needle scans the pad in the direction 4A of entry.

In the case shown in the graph 3a, even if the area fraction of the vias 119a to the top surface of the first pad 116 is increased, it is realistically impossible to reduce the probability of cracks to 0%. On the other hand, if in the case shown in the graph 3b the area fraction of the vias 119b to the top surface of the first pad 116 is set at 40% or if in the case shown in the graph 3c the area fraction of the network via 119 to the top surface of the first pad 116 is set at 48%, it is obviously possible to reduce the probability of cracks to 0%. In this embodiment, the first pad 116 is used as a comparison object for description. However, as obvious from the structure of the semiconductor device shown in FIG. 1, also if the second pad 121 is used as a comparison object, the same is applied.

The reason why the result shown in FIG. 3 can be obtained as described above is considered as follows. Since the strength of the underlying structure of the second pad 121 is enhanced with increase in the above-mentioned fraction of the via area, this decreases the probability of cracks. Furthermore, when the vias 119a are orthogonal to the direction 4A where the probe needle enters as shown in FIG. 4A, a high probability of cracks is obtained. On the other hand, when the vias 119b are parallel to the direction 4A where the probe needle enters, a low probability of cracks is obtained. Therefore, in the cases shown in FIGS. 4A and 4B, anisotropy is noticeably found in the probability of cracks.

Such anisotropy in the probability of cracks noticeably appears, in particular, when vias filled with tungsten (W) by a CVD method are used. The reason for this is that when tungsten of a body-centered cubic (bcc) structure is used for vias, the <110> axes of tungsten crystals serving as the orientation axes thereof exist in a plane parallel to the principal surface of the silicon substrate 101 and are orthogonal to the longitudinal direction of the vias 119a and 119b. It will be described later in detail with reference to FIG. 9A. More particularly, tungsten grows, in fibrous form, along the <110> axes serving as the orientation axes of tungsten crystals. Thus, while it is tolerant of a shearing stress orthogonal to the direction (the <110> axis) where it grows in fibrous form, it is intolerant of a shearing stress parallel to the direction (the <110> axis) where it grows in fibrous form. Therefore, as described above, anisotropy has been found in the probability of cracks.

In order to solve anisotropy in the probability of cracks, a via in the form of a single continuous structure (network-like) is employed. In addition, it has been found that anisotropy in the probability of cracks can be solved by making the distribution of orientations of the <110> axes serving as the orientation axes of crystals of tungsten constituting the via substantially uniform in a plane parallel to the principal surface of the silicon substrate 101. This will be described later with reference to FIG. 9B. For example, when, as shown in FIG. 4C, a network via 119 is used which has a honeycomb structure whose spatial symmetry in a plane parallel to the principal surface of the silicon substrate 101 is a 3-fold symmetry, the distribution of orientations of the <110> axes serving as the orientation axes of tungsten crystals becomes substantially uniform in a plane parallel to the principal surface of the silicon substrate 101. Therefore, it has been found that in this case anisotropy in the probability of cracks is not caused.

Hence, in the case shown in FIG. 4C, a stress applied to the network via 119 can be dispersed wherever the direction 4A where the probe needle enters is directed. This allows the underlying structure of the second pad 121 to be strong enough to suppress the probability of cracks. Furthermore, in the formation of the line-shaped vias, normally, it is not easy, due to process integration, to provide the vias to set the area fraction of the vias to the top surface of the first pad 116 at 50% or more. However, in the formation of the network via 119 having a honeycomb structure, it is easy to provide the network via 119 to set the area fraction of the network via 119 to the top surface of the first pad 116 at 50% or more. This can prevent cracks from occurring in the bonding pad part, resulting in no malfunction in the semiconductor device.

A method for fabricating a semiconductor device according to an embodiment of the present invention will be described hereinafter with reference to FIGS. 5A through 5C, 6A, 6B, 7A, 7B, and 8.

FIGS. 5A through 5C, 6A, 6B, 7A, 7B, and 8 are cross sectional views showing the principal part of the semiconductor device according to the above embodiment of the present invention in process steps of the method for fabricating the semiconductor device.

Figure 5A:
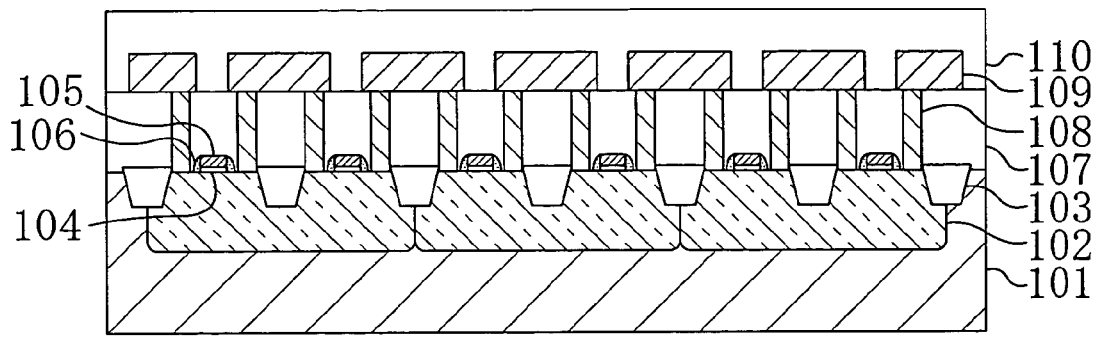
FIGS. 5A through 5C are cross-sectional views showing the principal part of a semiconductor device according to an embodiment of the present invention in process steps of a method for fabricating the semiconductor device.

First, as shown in FIG. 5A, prior to the formation of a connection structure between a semiconductor element and a bonding pad part, a diffusion layer 102 is already formed in the surface of a silicon substrate 101, a gate insulating film 104 and a gate electrode 105 are already successively formed on each of element formation regions defined by an isolation insulating film 103 located in the silicon substrate 101, and a sidewall 106 is already formed on the side surfaces of the gate insulating film 104 and gate electrode 105. Then, a first interlayer insulating film 107 is formed on the silicon substrate 101 to cover the gate insulating films 104, the gate electrodes 105 and the sidewalls 106. Subsequently, first vias 108 are formed in the first interlayer insulating film 107 to allow electrical connection between the diffusion layer 102 and first interconnects 109 that will be described later. Next, a first interconnect layer is formed on the first interlayer insulating film 107 and then patterned to form the first interconnects 109. Subsequently, a second interlayer insulating film 110 is formed on the first interlayer insulating film 107 to cover the first interconnects 109.

Figure 5B:
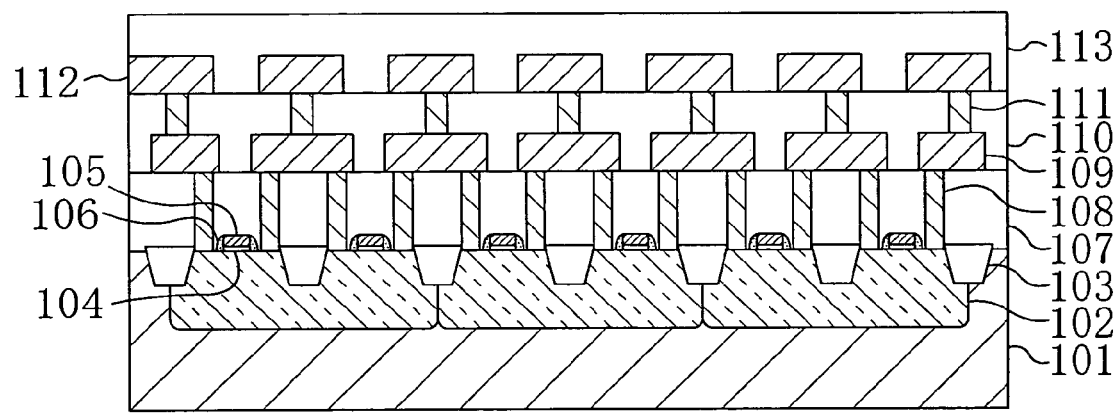

Next, as shown in FIG. 5B, second vias 111 are formed in the second interlayer insulating film 110 to allow electrical connection between the first interconnects 109 and second interconnects 112 that will be described later. Next, a second interconnect layer is formed on the second interlayer insulating film 110 and then patterned to form the second interconnects 112. Subsequently, a third interlayer insulating film 113 is formed on the second interlayer insulating film 110 to cover the second interconnects 112.

Figure 5C:
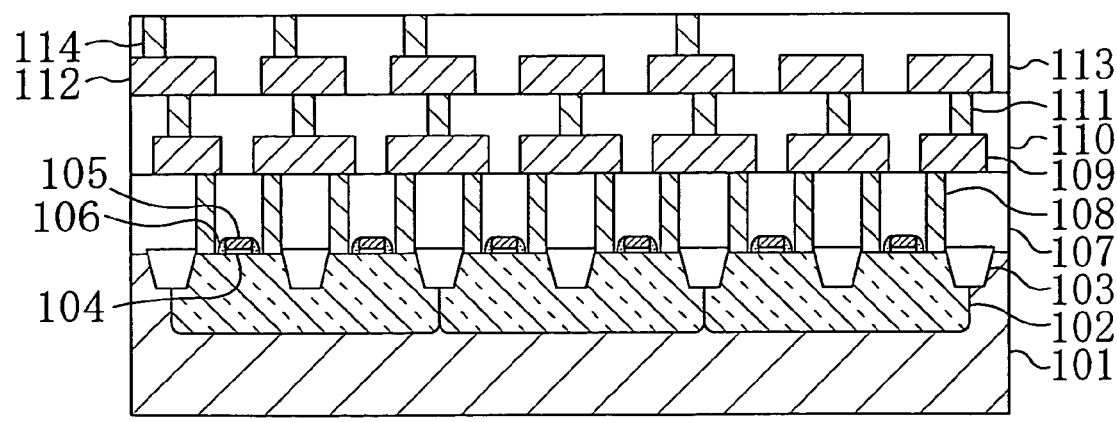

Next, as shown in FIG. 5C, third vias 114 are formed in the third interlayer insulating film 113 to allow electrical connection between the second interconnects 112 and third interconnects 115 or a first pad 116 that will be described later.

Figure 6A:
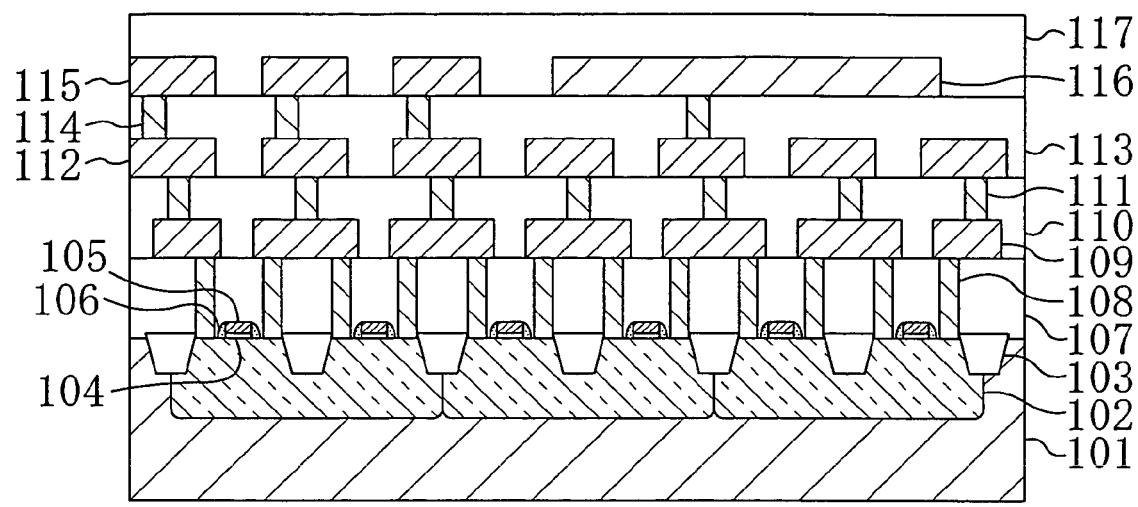
FIGS. 6A and 6B are cross-sectional views showing the principal part of the semiconductor device according to the embodiment of the present invention in another process steps of a method for fabricating the semiconductor device.

Next, as shown in FIG. 6A, a third interconnect layer of aluminum is formed on the third interlayer insulating film 113 and then patterned, thereby forming the third interconnects 115 and the first pad 116 to allow electrical connection with the corresponding third vias 114. Subsequently, a fourth interlayer insulating film 117 is formed on the third interlayer insulating film 113 to cover the third interconnects 115 and the first pad 116.

Figure 6B:
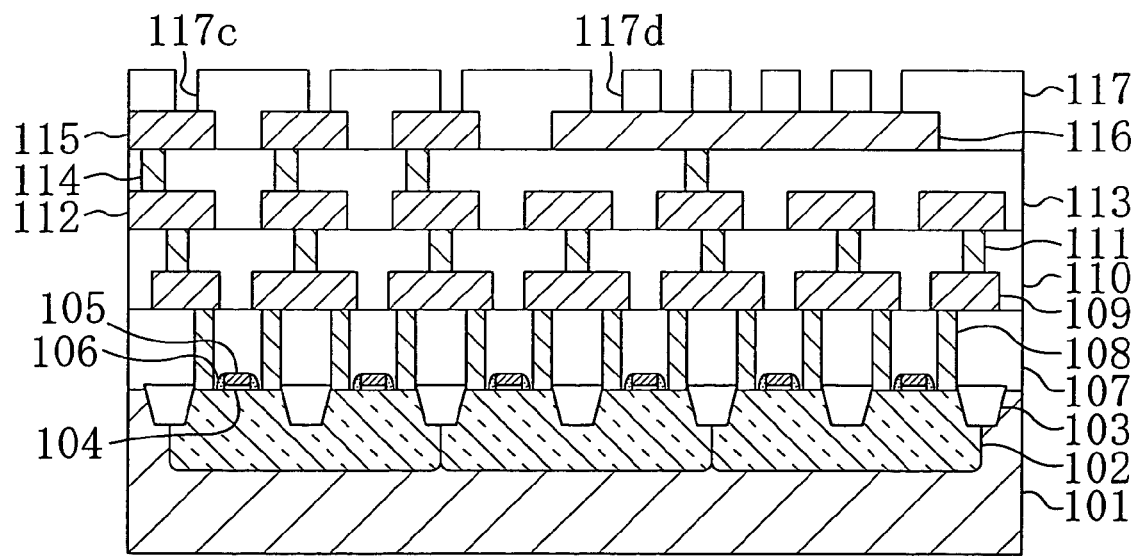

Next, as shown in FIG. 6B, hole-like first openings 117c are formed in the fourth interlayer insulating film 117 to reach the corresponding third interconnects 115, and a trench-like second opening 117d is formed therein to reach the first pad 116. The second opening 117d is formed only on the first pad 116.

Figure 7A:
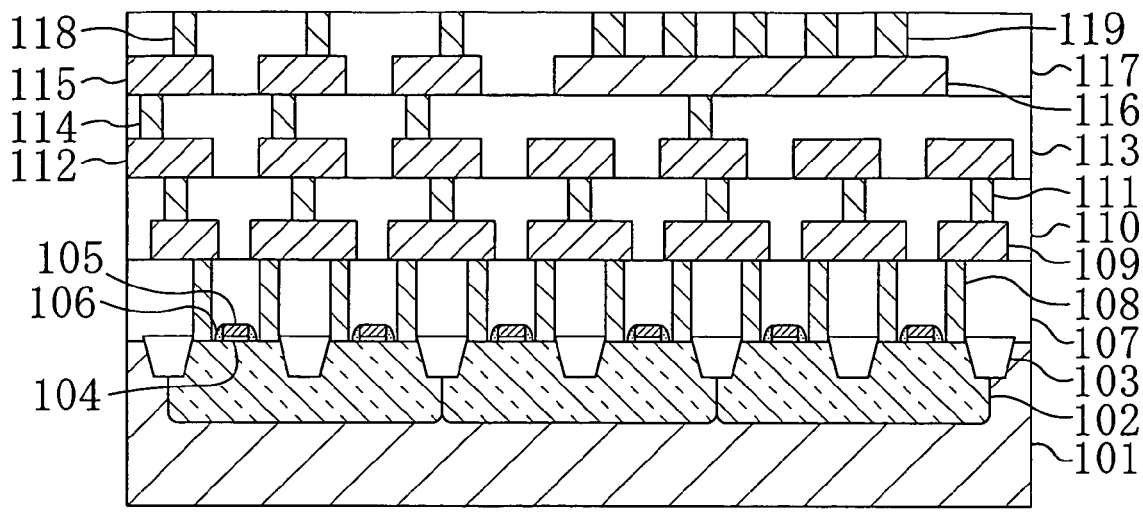
FIGS. 7A and 7B are cross-sectional views showing the principal part of the semiconductor device according to the embodiment of the present invention in yet another process steps of a method for fabricating the semiconductor device.

Next, as shown in FIG. 7A, the first openings 117c and the second opening 117d are filled with tungsten, and then tungsten deposited outside the first openings 117c and the second opening 117d is removed. In this way, fourth vias 118 are formed to allow electrical connection between the third interconnects 115 and fourth interconnects 120 that will be described later and a network via 119 is formed to allow electrical connection between the first pad 116 and a second pad 121 that will be described later. The fourth vias 118 and the network via 119 can simultaneously be formed through the same process steps without the use of individual process steps.

Figure 7B:
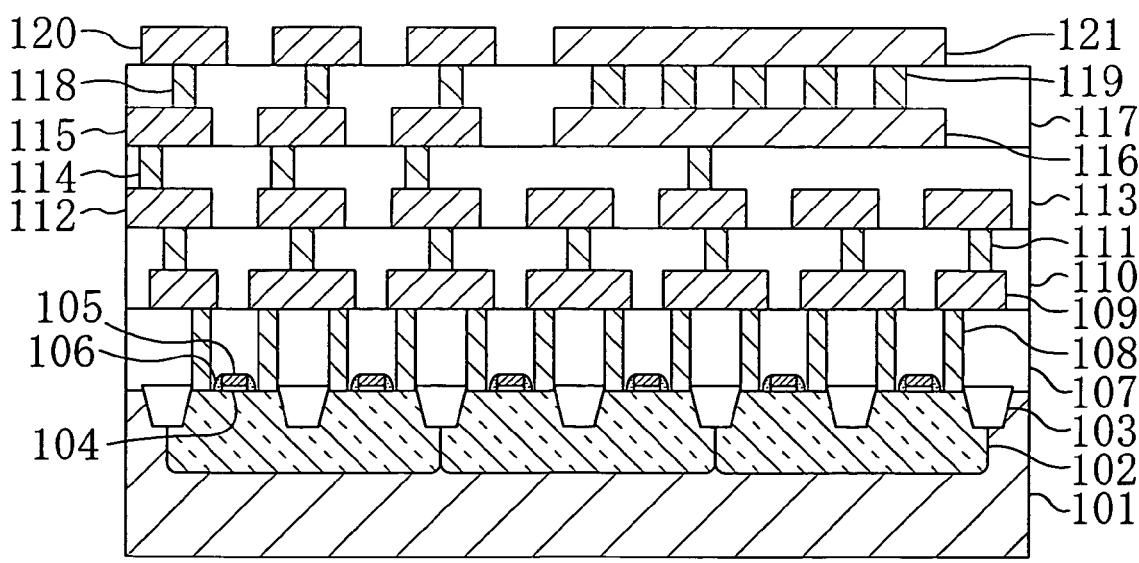

Next, as shown in FIG. 7B, a fourth interconnect layer of aluminum is formed on the fourth interlayer insulating film 117 and then patterned, thereby forming the fourth interconnects 120 to allow electrical connection with the third interconnects 115 through the fourth vias 118 and the second pad 121 to allow electrical connection with the first pad 116 through the network via 119.

Figure 8:
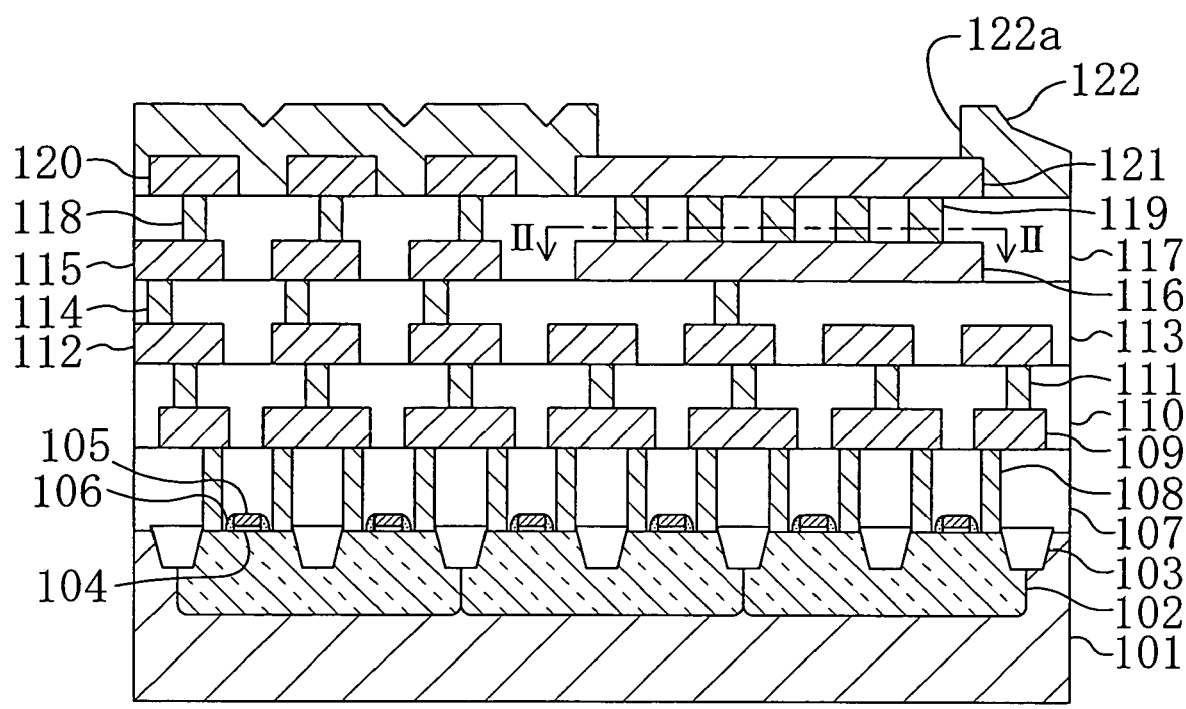
FIG. 8 is a cross-sectional view showing the principal part of the semiconductor device according to the embodiment of the present invention in yet another process step of a method for fabricating the semiconductor device.

Next, as shown in FIG. 8, a protective film 122 is formed on the fourth interlayer insulating film 117 to cover the fourth interconnects 120 and the second pad 121. Thereafter, a pad opening 122a is formed in the protective film 122 to expose the top surface of the second pad 121.

In this embodiment, as described above, the network via 119 is formed between the second pad 121 and the first pad 116. In this case, in plan configuration, the fraction of the area of the network via 119 formed immediately below the pad opening 122a to the area of a region on which the pad opening 122a is formed is preferably 50% or more. This can ensure a high strength of the underlying layer of the second pad 121 against the load applied to the second pad 121 exposed at the pad opening 122a during probing and bonding. In this way, cracks can be prevented from occurring in the underlying layer of the second pad 121.

Figure 9A:
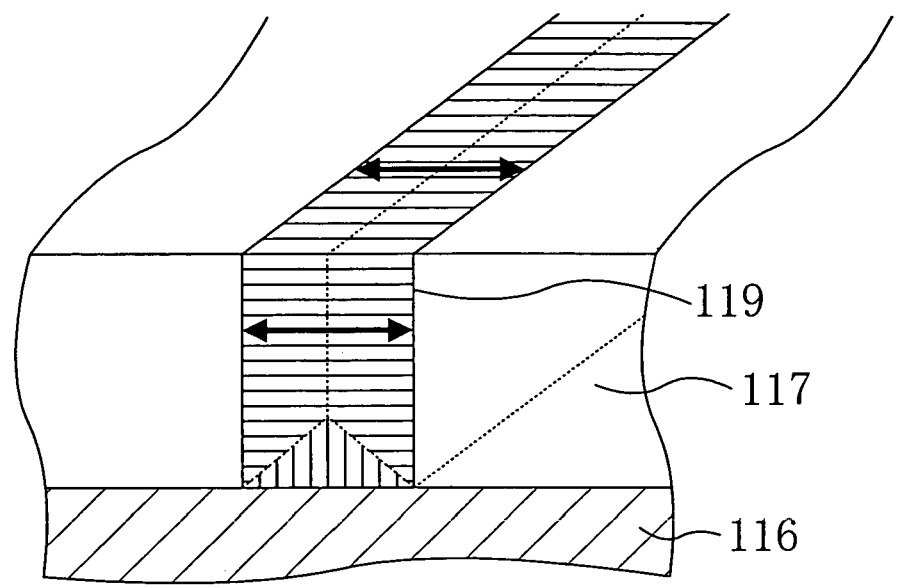
FIG. 9A is a perspective view showing an exemplary structure of a network via according to the embodiment of the present invention.
Figure 9B:
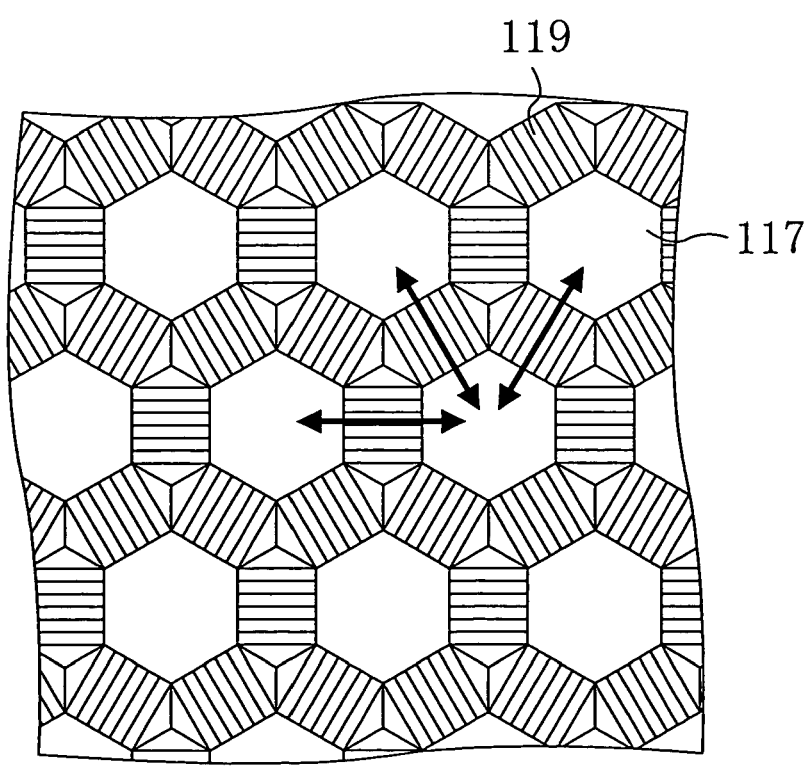
FIG. 9B is a plan view showing the exemplary structure of the network via according to the embodiment of the present invention.

FIG. 9A is an enlarged perspective view showing a part of the section taken along the line II-II in FIG. 8, and FIG. 9B is a plan view taken along the line II-II shown in FIG. 8.

As shown in FIG. 9A, when the network via 119 formed on the first pad 116 is filled with tungsten (W) by a CVD method, tungsten has a body-centered cubic (bcc) structure, and the <110> axes of tungsten crystals serving as the orientation axes thereof exist in a plane parallel to the principal surface of the silicon substrate 101 (as shown in arrows in this drawing).

Furthermore, when, as shown in FIG. 9B, the network via 119 is a honeycomb-shaped via whose spatial symmetry in a plane parallel to the principal surface of the silicon substrate 101 is a 3-fold symmetry, the distribution of orientations of the <110> axes serving as the orientation axes of crystals of tungsten constituting the network via 119 becomes substantially uniform in a plane parallel to the principal surface of the silicon substrate 101 (as shown in arrows in this drawing). This can ensure a high strength of the underlying structure of the second pad 121 against stresses caused by loads applied from any direction to the second pad 121 during probing and bonding. This can prevent cracks from occurring in the underlying layer of the second pad 121.

Furthermore, in order to form the network via 119 simultaneously with the fourth vias 118, the width of the trench-like second opening 117d for forming the network via 119 is defined with reference to the diameter of each fourth via 118. This will be described with reference to FIGS. 10 and 11.

Figure 10:
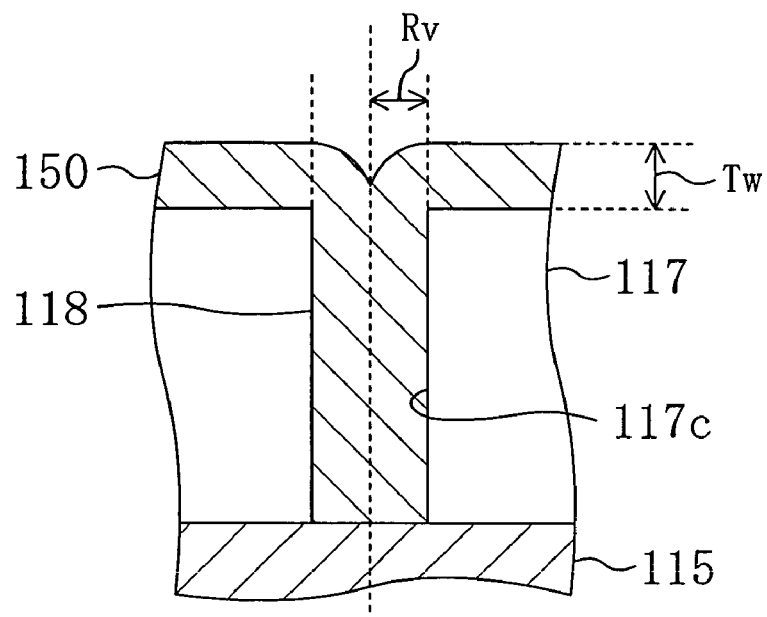
FIG. 10 is a cross-sectional view showing how a first opening is filled with tungsten, for explaining the relationship between the first opening and the thickness of a tungsten film on a fourth interlayer insulating film.

FIG. 10 shows how a tungsten film is deposited to fill the inside of the hole-like first openings 117c formed in the fourth interlayer insulating film 117. In this case, when the radius Rv of each first opening 117c is larger than the thickness Tw of the tungsten film 150 deposited on the fourth interlayer insulating film 117, this provides a cavity in the middle of the width of the fourth via 118. Therefore, the tungsten film 150 must be deposited on the fourth interlayer insulating film 117 to have a thickness Tw larger than the radius Rv of each first opening 117c.

Figure 11:
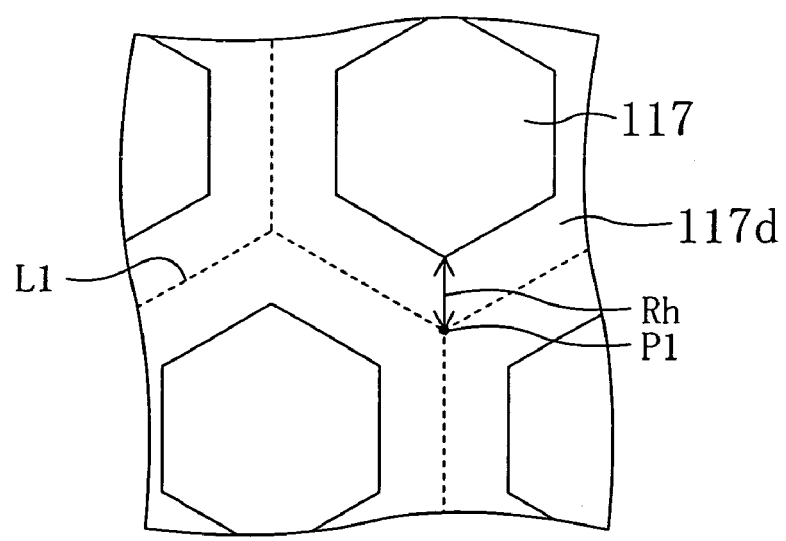
FIG. 11 is a plan view showing a network via, for explaining the relationship between a first opening and a second opening.
Figure 12:
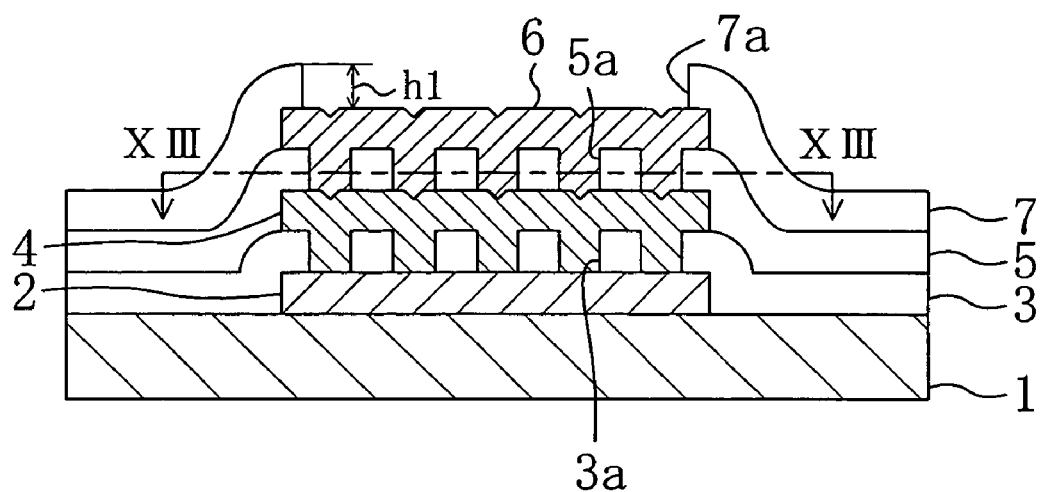
FIG. 12 is a cross-sectional view showing a known semiconductor device having an electrode pad part.
Figure 13:
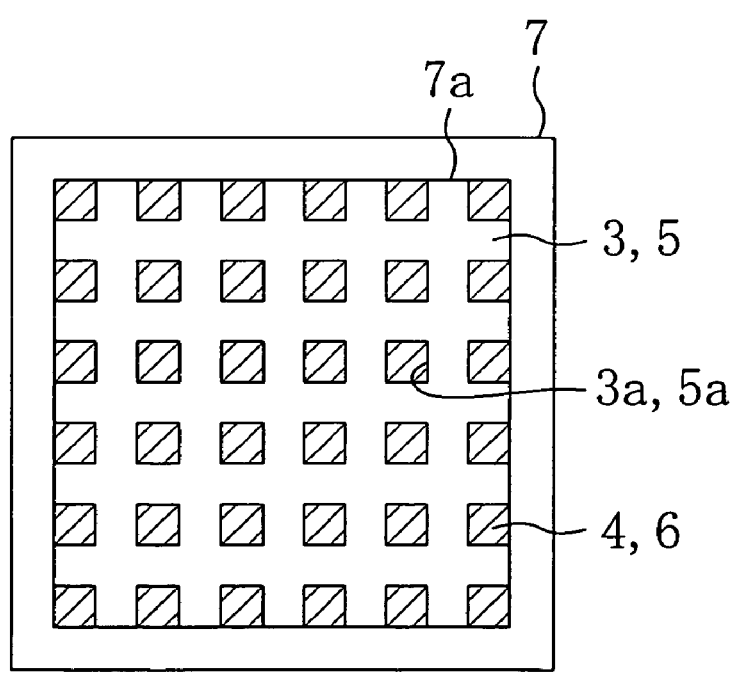
FIG. 13 is a plan view showing the known semiconductor device having an electrode pad part.
Figure 14:
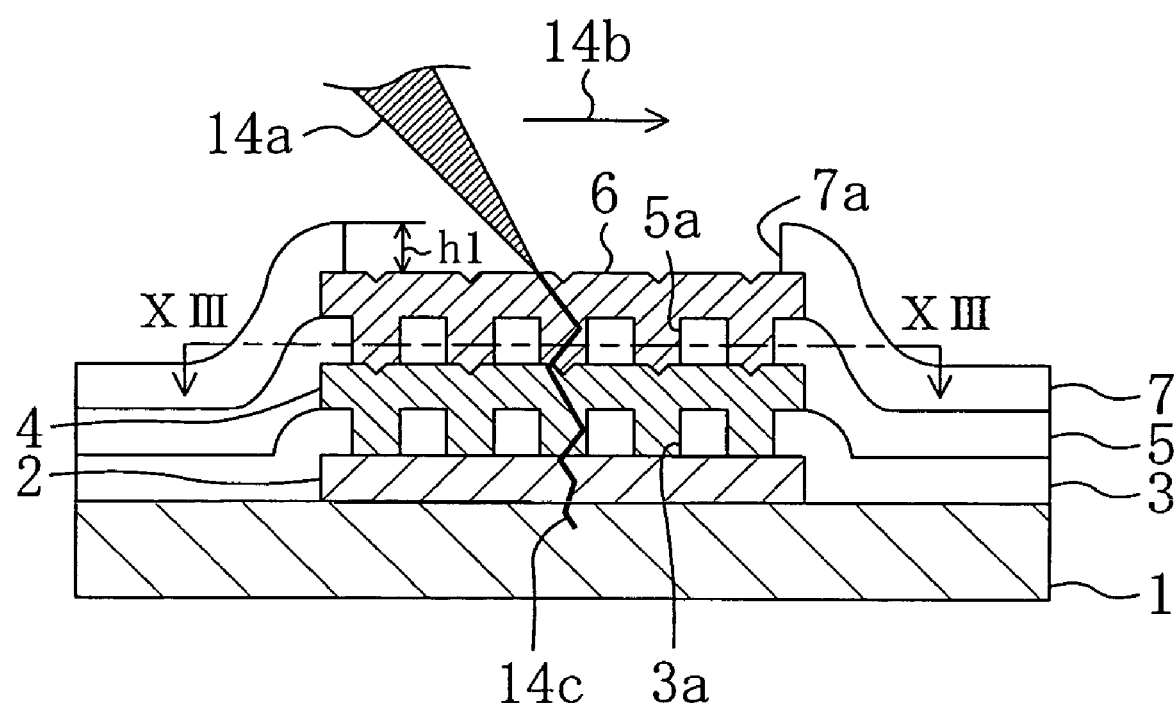
FIG. 14 is a cross-sectional view showing how a crack is formed in the known semiconductor device having an electrode pad part.

FIG. 11 shows the trench-like second opening 117d for forming the network via 119 having a honeycomb structure. The intersection point P1 of the center lines L1 of the second opening 117d is the point at which the distance from the fourth interlayer insulating film 117 is longest (distance Rh). The relationship among the distance Rh, the radius Rv of each first opening 117c and the thickness Tw of the tungsten film 150 must be Rv≦Rh<Tw. Therefore, the thickness Tw of the tungsten film 150 must be increased with increase in distance Rh. In this case, the amount of polishing of the tungsten film 150 deposited on the fourth interlayer insulating film 117 increases, resulting in increased production cost. Therefore, the distance Rh preferably has the same size as the radius Rv. A fabricating process of the semiconductor device is carried out to satisfy the above relationship, thereby forming the fourth vias 118 and the network via 119 at the same time.

According to the semiconductor device and the method for fabricating the same of this embodiment, as described above, cracks can be restrained from occurring in the underlying layer of the second pad 121. Thus, in the semiconductor device and the method for fabricating the same of this embodiment, there can be realized a semiconductor device structure in which semiconductor active elements are formed below the second pad 121 occupying a large area on a semiconductor chip. Therefore, according to the semiconductor device and the method for fabricating the same of this embodiment, the area of the semiconductor chip can drastically be reduced using a known process without miniaturization of semiconductor active elements or the like.

In the semiconductor device and the method for fabricating the same of this embodiment, a description was given of the case where the vias or network via are formed of tungsten and also the case where the interconnects or pads are formed of aluminum. However, all or any of the vias, network via, interconnects and pads may be formed of copper. When the vias, network via, interconnects, or pads are formed of copper, either of a single damascene process and a dual damascene process can be used.

As described above, the present invention is useful for the connection structure between an electrode pad and an interconnect layer in a semiconductor device having a pad-on-element (POE) type probe pad that is formed on the semiconductor active elements.

What is claimed is:
1. A semiconductor device comprising:
    a first insulating film formed on a semiconductor substrate;
    a first metal pattern formed on the first insulating film;
    a second insulating film formed on the first metal pattern;
    a second metal pattern formed on the second insulating film; and
    a third metal pattern connecting between the first metal pattern and the second metal pattern, said third metal pattern being formed in the second insulating film,
    wherein the third metal pattern is a single continuous structure having a honeycomb structure.
2. The semiconductor device of claim 1, further comprising
    at least one first interconnect electrically insulated from the first metal pattern through the first insulating film, said first interconnect being formed directly below the first metal pattern,
    wherein the first metal pattern is different from the first interconnect in electrical potential.
3. The semiconductor device of claim 1, farther comprising at least one second interconnect electrically connected to the first metal pattern with the first insulating film interposed therebetween, said second interconnect being formed directly below the first metal pattern,
    wherein the first metal pattern is connected to the second interconnect through a via formed in the first insulating film.
4. The semiconductor device of claim 1, wherein
    the first metal pattern is formed larger than the second metal pattern so that an edge of the first metal pattern does not overlap with the second metal pattern.
5. The semiconductor device of claim 1, wherein
    semiconductor active elements are formed on a region of the semiconductor substrate overlapping the first metal pattern in plan configuration.
6. The semiconductor device of claim 1, wherein
    in plan configuration, the proportion of the third metal pattern to the region of the semiconductor device in which the second metal pattern is formed is 50% or more.
7. The semiconductor device of claim 1, wherein
    the metal constituting the first metal pattern is aluminum or copper.
8. The semiconductor device of claim 1, wherein
    the metal constituting the second metal pattern is aluminum or copper.
9. The semiconductor device of claim 1, wherein
    the metal constituting the third metal pattern is tungsten or copper.
10. The semiconductor device of claim 1, wherein the principal orientation axes of crystals of a metal constituting the third metal pattern are parallel to a principal surface of the semiconductor substrate.
11. The semiconductor device of claim 10, wherein the distribution of orientations of the principal orientation axes of crystals of the metal constituting the third metal pattern is substantially uniform in a plane parallel to the principal surface of the semiconductor substrate.
12. The semiconductor device of claim 11, wherein the metal constituting the third metal pattern has a body-centered cubic structure, and the principal orientation axes of crystals of the metal constituting the third metal pattern are <110> axes.

* * * * *

UNITED STATES PATENT AND TRADEMARK OFFICE
CERTIFICATE OF CORRECTION

| | |
|---|---|
| PATENT NO. | : 7,312,530 B2 |
| APPLICATION NO. | : 10/945902 |
| DATED | : December 25, 2007 |
| INVENTOR(S) | : Shin Hashimoto et al. |

It is certified that error appears in the above-identified patent and that said Letters Patent is hereby corrected as shown below:

On page 2 of the title page of the patent, Item "(56) References Cited", under "FOREIGN PATENT DOCUMENTS", change "JP    5-343468    12/1993" to --JP    5-343466    12/1993--.

Signed and Sealed this

Nineteenth Day of August, 2008

JON W. DUDAS
*Director of the United States Patent and Trademark Office*